(12) United States Patent
Manna et al.

(10) Patent No.: US 10,176,980 B2
(45) Date of Patent: Jan. 8, 2019

(54) SELECTIVE DEPOSITION OF SILICON OXIDE FILMS

(71) Applicant: Applied Materials, Inc., Santa Clara, CA (US)

(72) Inventors: Pramit Manna, Sunnyvale, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/185,282

(22) Filed: Jun. 17, 2016

(65) Prior Publication Data

US 2017/0004974 A1 Jan. 5, 2017

Related U.S. Application Data

(60) Provisional application No. 62/185,388, filed on Jun. 26, 2015.

(51) Int. Cl.
| | |
|---|---|
| *H01L 21/033* | (2006.01) |
| *H01L 21/3213* | (2006.01) |
| *H01L 21/762* | (2006.01) |
| *H01L 21/02* | (2006.01) |
| *C23C 16/02* | (2006.01) |

(Continued)

(52) U.S. Cl.
CPC ........ *H01L 21/02164* (2013.01); *C23C 16/02* (2013.01); *C23C 16/045* (2013.01); *C23C 16/401* (2013.01); *H01L 21/02271* (2013.01); *H01L 21/02304* (2013.01); *H01L 21/02312* (2013.01); *H01L 21/02315* (2013.01); *H01L 21/033* (2013.01); *H01L 21/0337* (2013.01); *H01L 21/3213* (2013.01); *H01L 21/76281* (2013.01); *H01L 21/76283* (2013.01)

(58) Field of Classification Search
None
See application file for complete search history.

(56) References Cited

U.S. PATENT DOCUMENTS

| | | | |
|---|---|---|---|
| 6,235,354 B1 * | 5/2001 | Lee | .................. H01L 21/02164 |
| | | | 257/758 |
| 6,368,986 B1 | 4/2002 | Budge et al. | |

(Continued)

OTHER PUBLICATIONS

International Search Report and Written Opinion for International Application No. PCT/US2016/035302 dated Aug. 24, 2016.

*Primary Examiner* — Stephanie P Duclair
(74) *Attorney, Agent, or Firm* — Patterson + Sheridan LLP (57) ABSTRACT

Embodiments described herein generally provide a method for filling features formed on a substrate. In one embodiment, a method for selectively forming a silicon oxide layer on a substrate is provided. The method includes selectively depositing a silicon oxide layer within a patterned feature formed on a surface of a substrate, wherein the patterned feature comprises one or more sidewalls and a deposition surface at a bottom of the patterned feature, the one or more sidewalls comprise a silicon oxide, a silicon nitride, or a combination thereof, the deposition surface essentially consists of silicon, and the selectively deposited silicon oxide layer is formed on the deposition surface by flowing tetraethyl orthosilicate (TEOS) and ozone over the patterned feature.

19 Claims, 7 Drawing Sheets

(51) Int. Cl.
   *C23C 16/04*      (2006.01)
   *C23C 16/40*      (2006.01)

(56) References Cited

U.S. PATENT DOCUMENTS

| | | |
|---|---|---|
| 6,429,092 B1 | 8/2002 | Beintner et al. |
| 6,444,528 B1 | 9/2002 | Murphy |
| 6,503,851 B2 | 1/2003 | Budge et al. |
| 6,541,401 B1 * | 4/2003 | Herner .................. C23C 16/02 257/E21.243 |
| 7,790,633 B1 * | 9/2010 | Tarafdar ............ H01L 21/02164 257/E21.471 |
| 2002/0009855 A1 | 1/2002 | Kim |
| 2003/0032257 A1 | 2/2003 | Wensley et al. |
| 2005/0106318 A1 | 5/2005 | Partridge et al. |
| 2007/0298585 A1 * | 12/2007 | Lubomirsky ..... H01L 21/76229 438/435 |
| 2008/0299775 A1 * | 12/2008 | Wang .................. C23C 16/045 438/703 |
| 2012/0018783 A1 | 1/2012 | Iwasawa et al. |
| 2014/0239401 A1 * | 8/2014 | Basker .............. H01L 29/66803 257/365 |
| 2014/0273423 A1 * | 9/2014 | Fronheiser ........ H01L 29/42392 438/585 |

* cited by examiner

SELECTIVE DEPOSITION OF SILICON OXIDE FILMS

CROSS-REFERENCE TO RELATED APPLICATIONS

This application claims priority to U.S. provisional patent application Ser. No. 62/185,388, filed Jun. 26, 2015, which is herein incorporated by reference.

BACKGROUND

Field

Embodiments of the present disclosure generally relate to methods for forming a film on a semiconductor surface.

Description of the Related Art

Semiconductor device geometries have dramatically decreased in size since their introduction several decades ago. Modern semiconductor fabrication equipment routinely produces devices with 45 nm, 32 nm, and 28 nm feature sizes, and new equipment is being developed and implemented to make devices with even smaller geometries. The decreasing device sizes result in structural features having decreased aspect ratios, or decreased width relative to height of features within the formed device. As features narrow in width, gap-filling and patterning become more challenging.

Filling features with lower aspect ratios presents challenges because of the risk of voids. Voids occur when deposited material adheres not only to the bottom of features but also to sidewalls, growing across the feature before it is completely filled. Such voids result in decreased reliability of integrated circuits.

Selective deposition of silicon oxide film on other dielectric films is desirable for bottom-up gap-fill and patterning applications. One effective method for selective deposition of silicon oxide film comprises flowing tetraethyl orthosilicate (TEOS) and ozone over a substrate at sub-atmospheric pressure. Although silicon oxide film will grow on a silicon surface using this method, it will also grow on silicon nitride or thermal silicon oxide surfaces.

Therefore, there is a need for improved methods of selectively filling patterned a semiconductor structures that are formed through silicon nitride and silicon oxide layers.

SUMMARY

Embodiments described herein generally relate to the deposition and treatment of thin films for gap filling. More particularly, the embodiments described herein relate to selective deposition of silicon oxide films for feature-filling applications.

One embodiment herein provides a method for selectively forming a silicon oxide layer on a substrate, comprising selectively depositing a silicon oxide layer within a patterned feature formed on a surface of a substrate, wherein the patterned feature comprises one or more sidewalls and a deposition surface at a bottom of the patterned feature, the one or more sidewalls comprise a silicon oxide, a silicon nitride, or a combination thereof, the deposition surface essentially consists of silicon, and the selectively deposited silicon oxide layer is formed on the deposition surface by exposing the patterned feature to tetraethyl orthosilicate (TEOS) and ozone.

Another embodiment herein provides a method for selectively forming a silicon oxide layer on a substrate, comprising selectively depositing a silicon oxide layer within a patterned feature formed on a surface of a substrate, wherein the patterned feature comprises one or more sidewalls and a deposition surface at a bottom of the patterned feature, the one or more sidewalls comprise a silicon oxide, a silicon nitride, or a combination thereof, the deposition surface essentially consists of silicon, and the selectively deposited silicon oxide layer is formed on the deposition surface by flowing tetraethyl orthosilicate (TEOS) and ozone over the patterned feature, etching the selectively deposited silicon oxide layer, and repeating flowing tetraethyl orthosilicate (TEOS) and ozone over the patterned feature and etching the selectively deposited silicon oxide layer one or more times.

Another embodiment herein provides a method for selectively forming a silicon oxide layer on a substrate, comprising selectively depositing a silicon oxide layer within a patterned feature formed on a surface of a substrate, wherein the patterned feature comprises one or more sidewalls and a deposition surface at a bottom of the patterned feature, and each of the sidewalls has a base and a cap, wherein the cap of the one or more sidewalls comprises a silicon nitride, and a surface area of the cap comprises at least one-third of a surface area of the sidewall, the deposition surface essentially consists of silicon, and the selectively deposited silicon oxide layer is formed on the deposition surface by flowing tetraethyl orthosilicate (TEOS) and ozone over the patterned feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally provide a method for filling features formed on a substrate. In particular, embodiments described herein generally provide for selective deposition of a silicon oxide material within dielectric-containing patterned features on a substrate.

Figure 1:
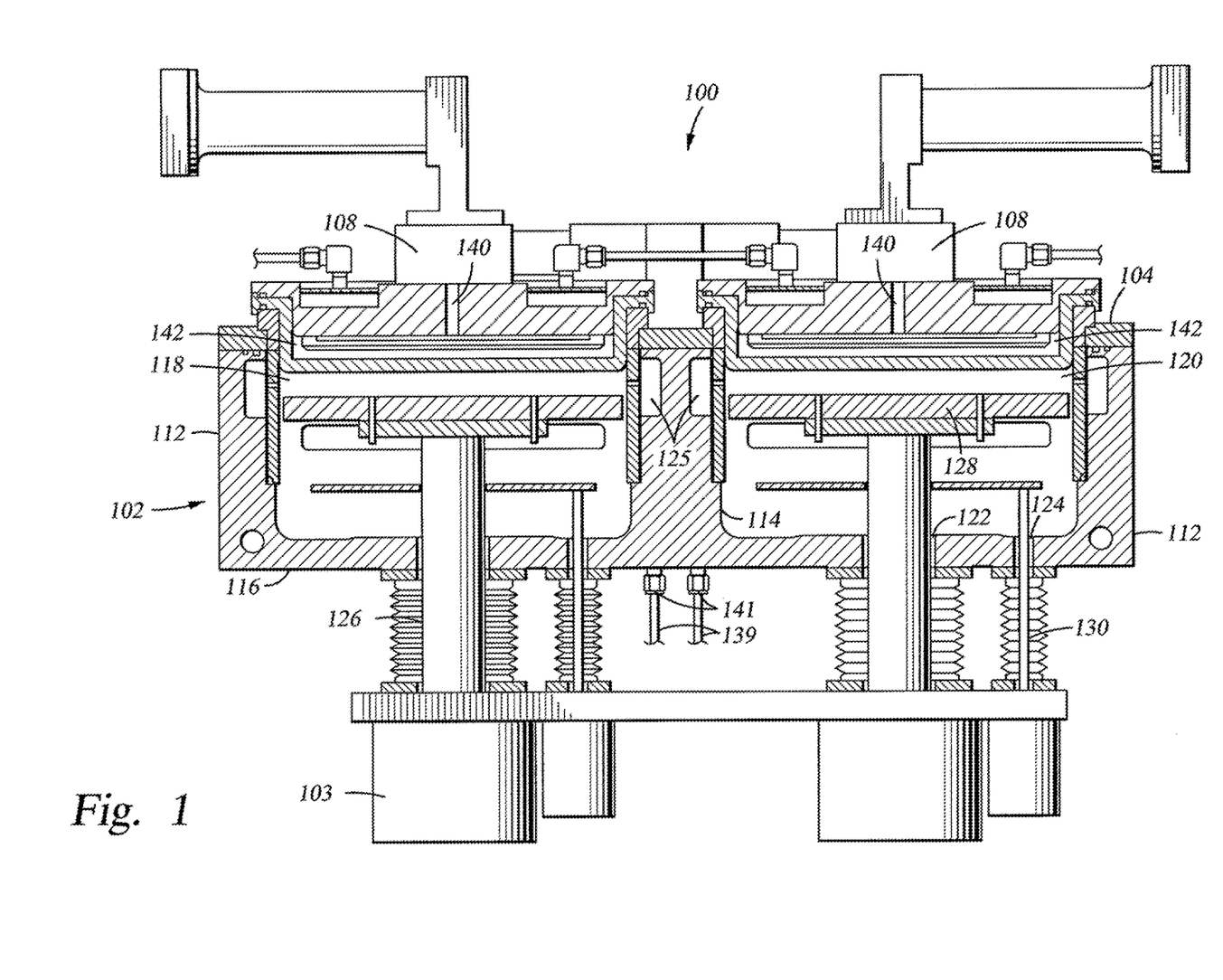
FIG. 1 is a schematic cross-sectional view of a processing chamber according to one embodiment.

FIG. 1 is a schematic cross-sectional view of a processing chamber 100 for use in selectively depositing films according to one embodiment. In one configuration, the processing chamber 100 may include a Producer GT chamber that is available from Applied Materials, Inc. of Santa Clara, Calif. In general, the processing chamber 100 includes two processing regions 118, 120. Chamber body 102 includes sidewall 112, interior wall 114, and bottom wall 116, which define the processing regions 118, 120. The bottom wall 116 in each processing region 118, 120 defines at least two passages 122, 124 through which a stem 126 of a heater pedestal 128 and a rod 130 of a wafer lift pin assembly are disposed, respectively.

The sidewall 112 and the interior wall 114 define two cylindrical annular processing regions 118, 120. A circumferential pumping channel 125 is formed in the chamber walls defining the processing regions 118, 120 for exhausting gases from the processing regions 118, 120 and controlling the pressure within each region 118, 120. The pumping channels 125 of each processing region 118, 120 are preferably connected to a common exhaust pump via a common exhaust channel (not shown) and exhaust conduits (not shown). Each region is preferably pumped down to a selected pressure by the pump and the connected exhaust system allows equalization of the pressure within each region. The pressure in the processing chamber during operation may be between 200 Torr and 700 Torr.

Each of the processing regions 118, 120 preferably includes a gas distribution assembly 108 disposed through the chamber lid 104 to deliver gases into the processing regions 118, 120. The gas distribution assembly 108 of each processing region includes a gas inlet passage 140 which delivers gas into a showerhead assembly 142. A gas source (not shown) is connected to the gas inlet passage 140, and is configured to deliver one or more precursor gases (e.g., TEOS, ozone, ammonia) and/or inert gases (e.g., nitrogen) to the processing regions 118 and 120 through the showerhead assembly 142. An RF feedthrough provides a bias potential to the showerhead assembly 142 to facilitate generation of a plasma between the showerhead assembly 142 and the heater pedestal 128.

The heater pedestal 128 is movably disposed in each processing region 118, 120 by a stem 126 which is connected to the underside of a support plate and extends through the bottom of the chamber body 102 where it is connected to a drive system 103. The stem 126 moves upward and downward in the chamber 106 to move the heater pedestal 128 to position a wafer thereon or remove a wafer therefrom for processing.

The chamber body 102 defines a plurality of vertical gas passages for each reactant gas and cleaning gas suitable for the selected process to be delivered in the chamber through the gas distribution assembly 108. Gas inlet connections 141 are disposed at the bottom of the chamber 106 to connect the gas passages formed in the chamber wall to the gas inlet lines 139. Gas inlet lines 139 in turn connect to gas source lines (not shown) and are controlled for delivery of gas to each processing region 118, 120.

The vacuum control system for the processing chamber 100 of the present disclosure may include a plurality of vacuum pumps in communication with various regions of the processing chamber 100, with each region having its own set-point pressure. An RF power delivery system is used to deliver RF energy to each processing region 118, 120 through each gas distribution assembly 108.

Figure 2A:
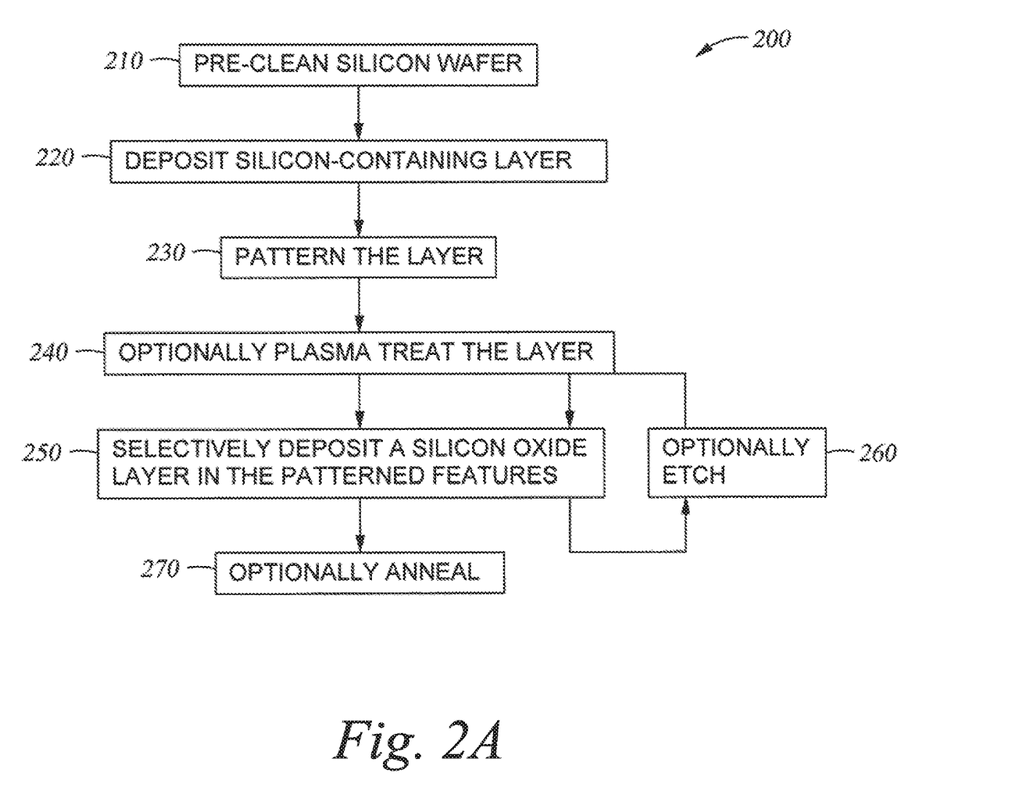
FIG. 2A is a block diagram of a method of selectively depositing a silicon oxide layer according to one embodiment.
Figure 2B:
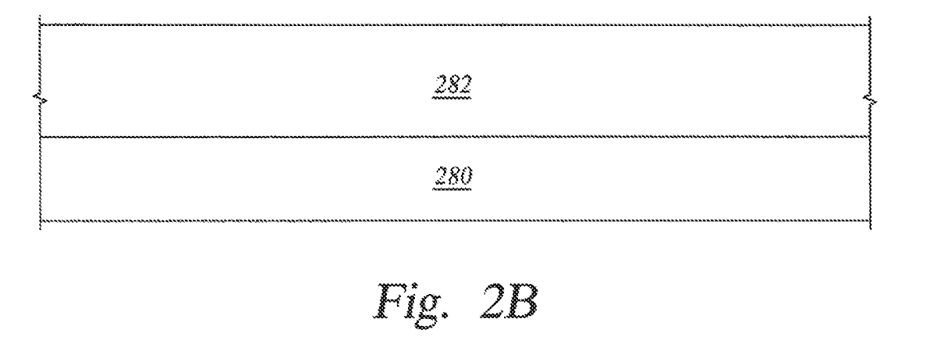
FIGS. 2B-2D are side cross-sectional views of a feature formed on a surface of a substrate by use of the blocks discussed in conjunction with FIG. 2A.
Figure 2C:
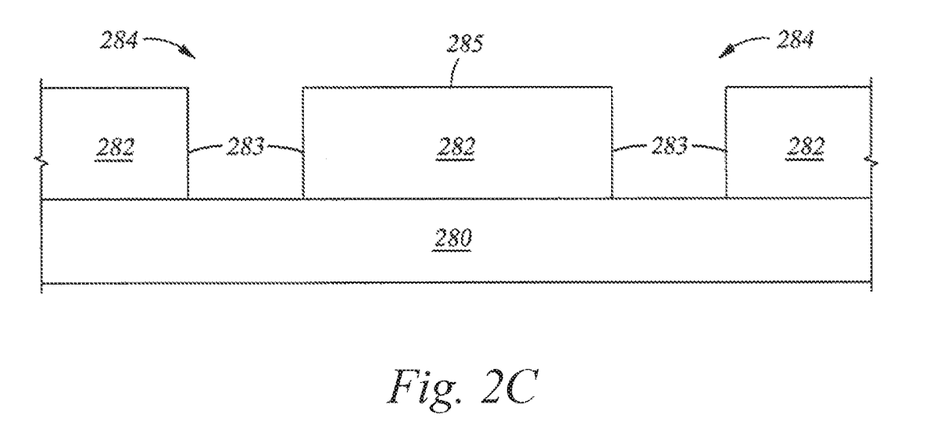
Figure 2D:
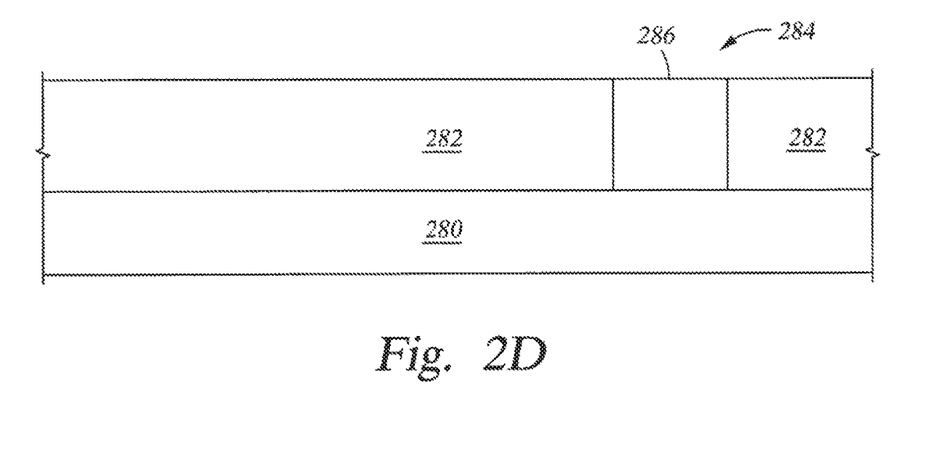

FIG. 2A is a block diagram 200 of a method of selectively depositing a silicon oxide layer according to one embodiment. FIGS. 2B-2D are side cross-sectional views of a feature formed on a surface of a substrate 280 by following the blocks discussed in conjunction with FIG. 2A. At block 210, a silicon wafer is pre-cleaned in preparation for deposition. Pre-cleaning may be necessary in some cases because bare silicon oxidizes in air and forms an undesirable native oxide layer. To ensure a good result, the wafer surface may be stripped of the native oxide layer and replaced with a hydrogen-terminated surface using either a wet or dry cleaning treatment.

At block 220, a silicon-containing layer 282 is deposited on the silicon substrate 280. The silicon-containing layer 282 may comprise, for example, silicon oxide ($SiO_2$) or silicon nitride (SiN). This silicon-containing layer 282 may be deposited by flowing a silicon precursor and an oxygen or nitrogen gas or plasma into the processing chamber.

At block 230, the silicon-containing layer is patterned, resulting in one or more features 284 being formed in the silicon-containing dielectric layer 282. The patterning process may include, for example, applying a photoresist, exposing and developing the photoresist to form a pattern on the silicon-containing layer, wet or dry etching the exposed portions of the silicon-containing layer, removing the photoresist, and cleaning the patterned surfaces (e.g., items 281, 283 and 285 in FIG. 2C) to prepare for additional processing. A person of ordinary skill in the art will appreciate that the patterning process may vary depending on the particular conditions and objectives of the process.

If the silicon-containing layer 282 was formed at block 220 using a silane precursor, the resulting silicon oxide layer may have a high level of silicon-hydrogen bonds. A typical deposition process may include delivering flows of monosilane $SiH_4$, molecular oxygen $O_2$, and $H_2$, although it should be understood that other precursor gases can be used. The selective deposition of silicon oxide into the patterned features 284 that are formed in the silicon-containing layer 282, which is performed at a later block, depends at least partially upon the silicon-containing deposited dielectric layer 282 having few or no hydrogen bonds at its exposed surface. Therefore, any silicon oxide containing layer that has a hydrogen terminated surface, such as a silane-formed silicon-containing layer, may need to be further treated to prevent the deposition of the selectively deposited silicon oxide film during block 250, from growing on these surfaces (e.g., feature sidewalls and field region). In some embodiments, the further treatment may include exposing the patterned surfaces of the silicon-containing layer, which was formed during block 220, to a plasma treatment during block 240 to replace the hydrogen terminated surface. For example, the plasma treatment at block 240 may comprise exposing the surface of the silicon-containing layer to a plasma treatment containing $NH_3$ or $N_2$ to remove the hydrogen bonds from the formed silicon-containing layer (e.g., $SiO_2$ layer).

Alternatively, the silicon-containing layer 282 deposited at block 220 may be formed using a tetraethyl orthosilicate (TEOS) precursor to form a dielectric layer, such as a $SiO_2$ or SiN layer. It is believed that a silicon-containing layer 282 that is formed using a TEOS precursor will have significantly fewer or no hydrogen bonds on its surface, so the optional plasma treatment at block 240 may be omitted.

At block 250, a silicon oxide layer 286 is selectively deposited in the patterned features 284. The silicon oxide layer 286 is deposited by flowing TEOS and ozone ($O_3$) into the processing chamber. The deposition process may be either a thermal process or a plasma-enhanced process. The thermal process may be performed using a deposition process that uses ozone ($O_3$) and TEOS in a temperature range of about 350-500° C. and a pressure range of 20-620 Torr. In a plasma-enhanced process, a controlled plasma may be formed adjacent to the substrate 280 by RF energy applied from the RF power supply. The tetraethyl orthosilicate (TEOS) may flow into a 300 mm substrate processing chamber at a rate between about 400 mg/minute and 2 g/minute. The ozone may flow into the 300 mm substrate processing chamber at a rate of about 10% to 18% by mass.

Figure 7:
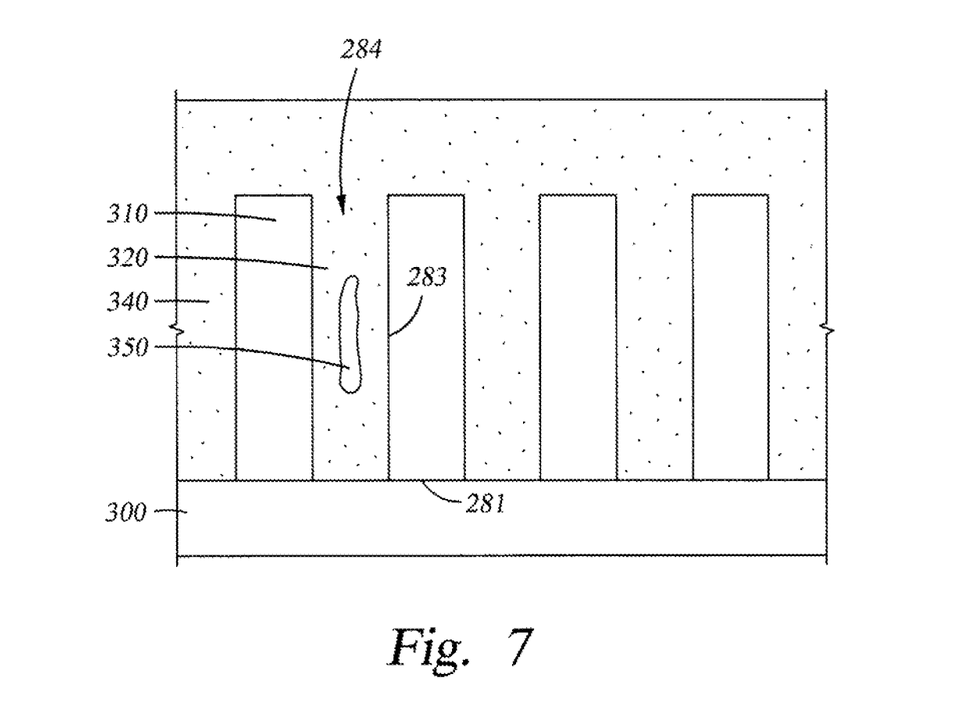
FIG. 7 illustrates a void that may result from growth on sidewalls of a feature rather than simple bottom-up growth.

Because the height of the features 284 may be much greater than the width of the features 284, it is advantageous to fill the features 284 from the bottom up. If growth occurs on the sidewalls 283 of features 284, voids or seams may be created, which leads to a less uniform and therefore less reliable integrated circuit. For example, FIG. 7 illustrates a void 350 that may result from growth on sidewalls 283 of a feature 284 rather than simple bottom-up growth.

The selective deposition process performed during block 250 has been observed to be able to minimize or prevent the formation of voids and seams by creating a growth condition on the bottom 281 of a feature 284 and a condition of limited or no growth on the sidewalls 283 of the feature 284. In this embodiment, the features 284, into which the selectively deposited film is formed, are composed of silicon oxide or silicon nitride or a combination thereof. Due to the post processing of the patterned dielectric layer(s) formed in block 220 or use of a specific type of patterned silicon oxide layer formed in block 220 (i.e., TEOS based layer) the surface of the patterned silicon-containing layer will have fewer Si-H bonds, and therefore offers few nucleation sites to promote initiation of growth of the selectively deposited layer. By contrast, the bottom 281 of the feature 284 (FIG. 2D), which can be considered as a deposition surface, may be composed of silicon, which has a high degree of Si—H bonds and therefore offers many nucleation sites to promote growth. Therefore, at block 250, the TEOS and ozone process results in deposition occurring preferentially on the bottom 281 of the feature 284, where the substrate 280 is composed of silicon. The TEOS and ozone-formed selectively deposited silicon oxide layer 286 (FIG. 2D) does not adhere well to the sidewalls 283 of the features 284, which are composed of silicon nitride, silicon oxide, or combination thereof. Therefore, the silicon oxide layer 286 that is selectively deposited using TEOS and ozone forms and adheres preferentially to the silicon substrate 280, resulting in uniform bottom-up growth of the silicon oxide layer without significant growth or adherence to the sidewalls 283. This process results in minimization of voids.

A substrate with Si—H bonding at its surface will provide nucleation sites, which allow for uniform or conformal growth on the substrate surface. Without Si—H bonds to promote growth, any growth of the selectively deposited layer on these types of surfaces will be non-uniform or island-like. Because growth occurs preferentially on the substrate 280, growth begins at the bottom 281 (i.e., deposition surface) of the patterned features 284 on the surface of the substrate 280. This generates uniform growth of the silicon oxide layer 286 with minimal voiding. By comparison, a silicon oxide formed by the processes disclosed in block 250 does not deposit evenly, for example, on a silicon nitride surface or a surface of a conventional thermal silicon oxide layer. As a result, the silicon oxide layer 286 selectively grows from the bottom 281 of the patterned feature 284, resulting in reducing voiding by use of a bottom-up fill process.

In some embodiments, the silicon oxide layer 286 formed during block 250 may undesirably adhere and grow on the sidewalls 283 of the features 284 (e.g., trenches). To address this issue, at block 260, the selectively deposited silicon oxide layer may be optionally etched using dilute hydrofluoric acid (DHF) to remove the low quality and thin formed layer on the sidewalls 283 and field region 285. After this optional etch at block 260, the substrate may be again subjected to the selective deposition process of block 250. These two blocks may be periodically repeated in order to improve selectivity in, for example, nitride-capped features, as discussed below.

After selective deposition of the silicon oxide layer at block 250 and optional periodic deposition and etching at block 260, the substrate may be optionally annealed, such as thermally processed using a lamp or other heat source, at block 270. The temperature in the substrate during the anneal block 270 may be between 300° Celsius and 480° Celsius. The substrate may be optionally etched by either dry or wet etch.

Figure 3A:
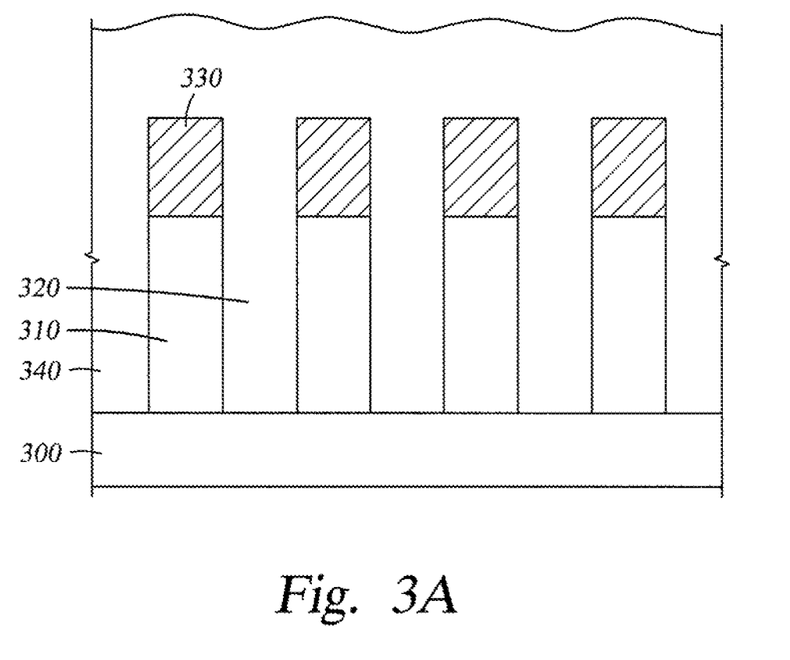
FIGS. 3A-3B are a histogram comparing wet etch rate on a silicon substrate to wet etch rate on a silicon nitride substrate.
Figure 3B:
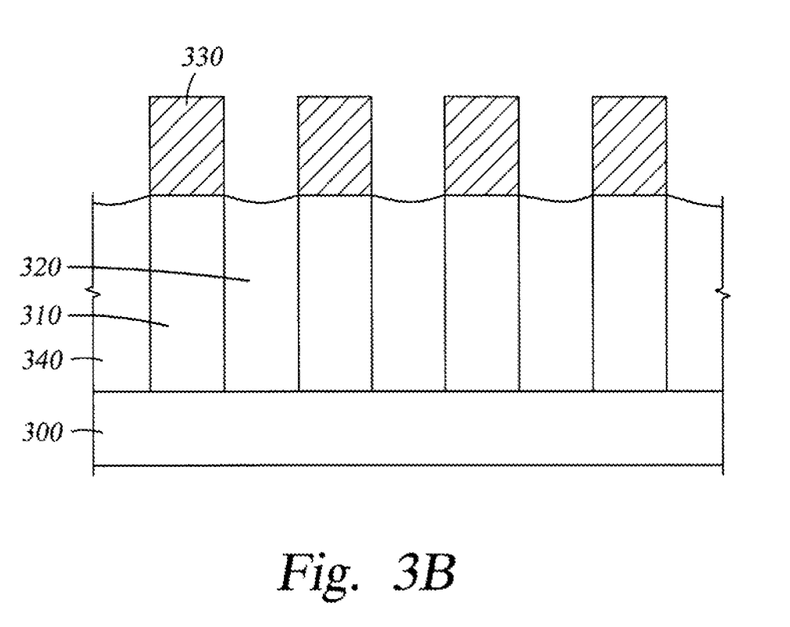

One advantage of selective deposition of silicon oxide is the relative improvement of wet etch rate of the film formed during block 250. In general, a higher wet etch rate may indicate a lower density and/or higher porosity of dielectric material. Therefore, the much lower wet etch rate of $SiO_x$ on a Si surface as opposed to SiN on a Si surface demonstrates the enhanced uniformity and therefore higher quality of the SiO layer. FIGS. 3A and 3B demonstrate the effectiveness of etching a selectively deposited silicon oxide layer. In FIG. 3A, a silicon-containing layer 310 is deposited over a substrate 300, as in block 220 of FIG. 2A. The silicon-containing layer 310 is patterned to form features 320, as in block 230 of FIG. 2A. Silicon nitride caps 330 are then provided on the patterned silicon-containing layer 310. The process for this block is discussed in greater detail below. A silicon oxide layer 340 is then selectively deposited in the features 320 of the patterned silicon-containing layer 310, as in block 250 of FIG. 2A. As discussed, the silicon oxide layer 340 formed in the features 320 is a high quality layer because of preferential growth of the selective silicon oxide on a silicon substrate. In FIG. 3B, the film is then etched, which may be achieved by exposure to 100:1 DHF. The DHF preferentially etches the silicon oxide layer 340 from the silicon nitride caps 330 due to its poor quality and low density while the silicon oxide layer 340 residing in the features 320 adjacent to the silicon-containing layer 310 remains intact due to its improved material properties.

Figure 4:
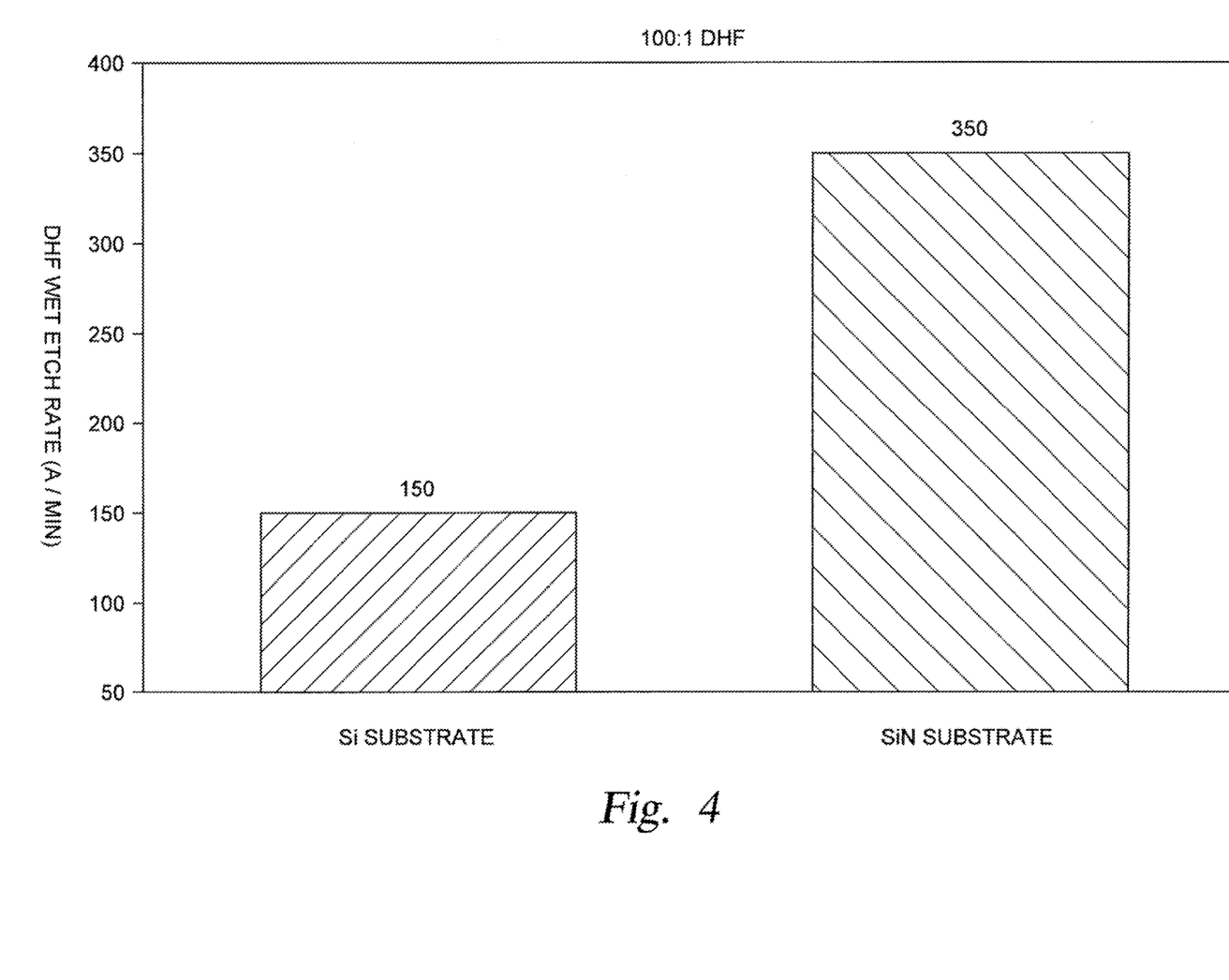
FIG. 4 is a schematic cross-sectional view of a film deposited according to one embodiment.

FIG. 4 is a histogram comparing wet etch rate on a silicon substrate to wet etch rate on a silicon nitride substrate. FIG. 4 represents a 100:1 DHF wet etch condition. As shown in FIG. 4, the DHF wet etch rate of SiN is more than double the DHF wet etch rate of Si. Therefore the much lower wet etch rate of SiO on a Si surface as opposed to SiN on a Si surface demonstrates the enhanced uniformity and therefore higher quality of the SiO layer. In other words, the film quality of the selectively grown film layer is high relative to portions of the selectively grown films formed on the nitride or unprepared oxide film.

Figure 5A:
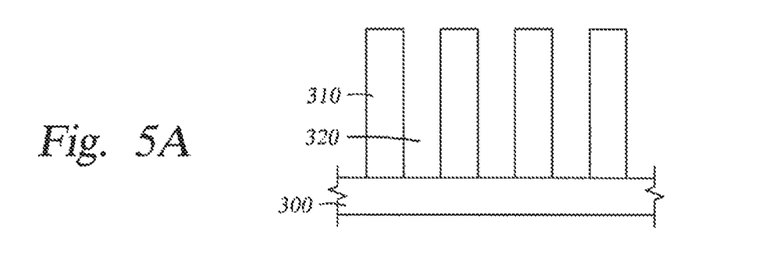
FIGS. 5A-5D are stages of a substrate having a film being directionally treated for selective deposition of silicon oxide according to one embodiment.

FIGS. 5A-5D demonstrate stages of a substrate having a film being directionally treated for selective deposition of silicon oxide according to one embodiment. The treatment forms silicon nitride caps 330 on top of the patterned silicon-containing layer 310. The advantage of the silicon nitride caps 330 is to prevent deposition of SiO on the sidewalls of the features 320 during the processes described in conjunction with block 250, resulting in enhanced bottom-up feature filling with minimization of voids and improved quality of the resulting film. One method for depositing the silicon nitride caps 330 is by directionally treating the substrate with a nitride-containing plasma. Examples of such a nitride-containing plasma may be NH$_3$ or N$_2$. FIG. 5A shows a patterned substrate before performing the nitridation process.

Figure 5B:
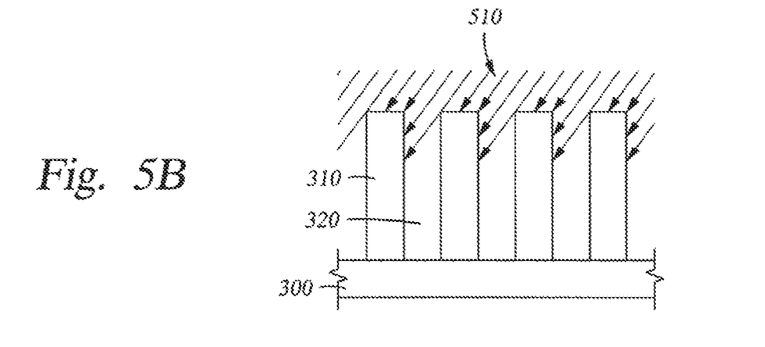

In FIG. 5B, the patterned silicon-containing layer 310 is treated with a directional plasma. The directional plasma treatment may be performed with an ion beam 510 at an angle with respect to a sidewall of the trench (i.e., feature 320). The ion beam 510 may be formed from ion assisted plasma. In one example, the ion beam 510 is formed from a nitrogen-containing plasma. The patterned silicon-containing layer 310 blocks the lower portion of the adjacent feature from the directional plasma treatment, creating a shadowing effect. As a result, only the top portions of each feature 320 are exposed to the directional plasma treatment.

Figure 5C:
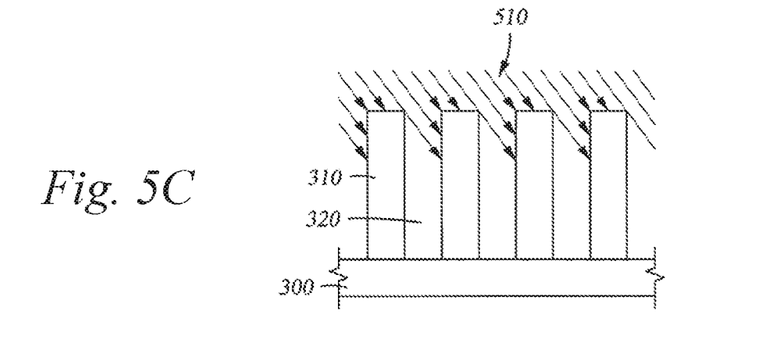

In FIG. 5C, the ion beam 510 is directed at the patterned silicon-containing layer 310 from another angle or the substrate is rotated relative to the impinging beam to assure that a uniform nitridation process is performed on the surface of the substrate.

Figure 5D:
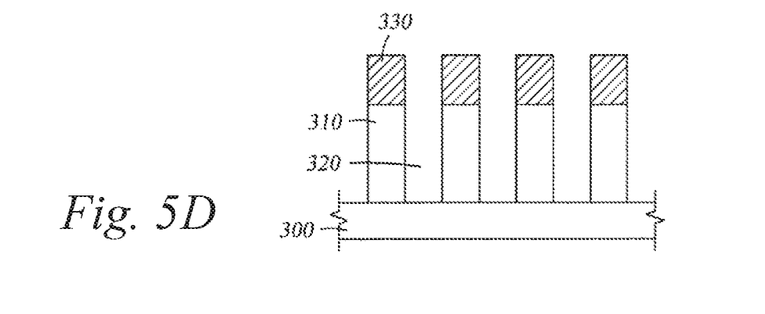

In FIG. 5D, the directional plasma treatment thus results in a silicon-containing layer 310 with features 320 wherein the top portions of the patterned silicon-containing layer 320 are nitrided. Because of the preferential growth of silicon oxide on silicon substrate rather than silicon nitride, when the directionally treated substrate is exposed to precursor gases described in block 250, the resulting silicon oxide film grows preferentially starting at the surface of the silicon substrate to fill the features. This preferential growth bottom-up growth prevents growth in from the sidewalls and results in a higher quality film with minimal voiding in the features 320.

Figure 6:
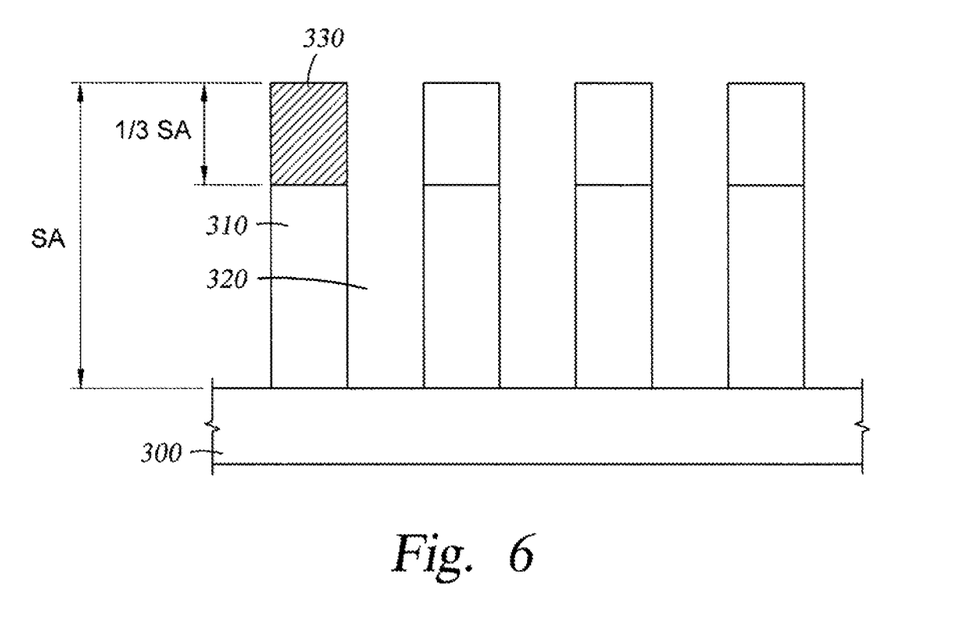
FIG. 6 is a schematic cross-sectional view of a substrate with patterned features for selective deposition according to one embodiment.

In some embodiments, to achieve a desired preferential growth, the surface area of the nitride caps 330 may be formed onto the substrate 310 so that it totals at least about one-third of the total surface area of the features 320. FIG. 6 is a schematic cross-sectional view of a substrate 300 with a patterned silicon-containing layer 310 and features 320 for selective deposition according to this embodiment, where the nitride caps 330 have a surface area totaling at least about one-third of the surface area of the features 320.

Embodiments of present disclosure provide preferential bottom-up growth of silicon oxide by selective deposition of silicon oxide films using TEOS and ozone at sub-atmospheric pressure. Oxide film deposited by this process grows on bare silicon surface and shows no growth/island like growth on silicon nitride and thermal silicon oxide surface. Because of the preferential growth of silicon oxide on silicon substrate rather than silicon nitride, when the directionally treated substrate is exposed to precursor gases, the resulting silicon oxide film grows preferentially starting at the surface of the silicon substrate to fill the features. This preferential growth bottom-up growth prevents growth in from the sidewalls and results in a higher quality film with minimal voiding in the features.

While the foregoing is directed to embodiments of the present disclosure, other and further embodiments of the disclosure may be devised without departing from the basic scope thereof, and the scope thereof is determined by the claims that follow.

The invention claimed is:

1. A method for selectively forming a silicon oxide layer on a substrate, comprising:
    selectively depositing a silicon oxide layer within a patterned feature formed on a surface of a substrate, wherein the patterned feature comprises one or more sidewalls and a deposition surface at a bottom of the patterned feature, and each of the sidewalls has a base and a cap,
    wherein the cap comprises a silicon nitride and the base comprises silicon oxide, and a first surface area of the cap is at least one-third of a surface area of the sidewall and a second surface area of the base is at least a portion of the surface area of the sidewall,
    wherein the deposition surface consists essentially of silicon, and the selectively deposited silicon oxide layer is formed on the deposition surface by exposing the patterned feature to tetraethyl orthosilicate (TEOS) and ozone to fill the patterned feature from the bottom of the patterned feature so that the selectively deposited silicon oxide layer is adjacent to the base and the cap; and
    etching the selectively deposited silicon oxide layer within the patterned feature to a depth that exposes portions of each sidewall corresponding to each respective cap, and leaves the base portion of the sidewall unexposed.

2. The method of claim 1, further comprising:
    after the selectively depositing a silicon oxide layer within the patterned feature, annealing the selectively deposited silicon oxide layer.

3. The method of claim 2, further comprising:
    after the annealing the selectively deposited silicon oxide layer, wet etching the silicon oxide layer.

4. The method of claim 1, wherein the tetraethyl orthosilicate (TEOS) flows into a 300 mm substrate processing chamber at a rate between 400 mg/minute and 2 g/minute.

5. The method of claim 4, wherein the ozone flows into the 300 mm substrate processing chamber at a rate of 10% to 18% by mass.

6. The method of claim 1, wherein the pressure in the processing chamber during operation is between 200 Torr and 700 Torr.

7. The method of claim 1, wherein the temperature during the anneal step is between 300 degrees Celsius and 480 degrees Celsius.

8. The method of claim 1, further comprising:
    before the selectively depositing a silicon oxide layer within a patterned feature, exposing the patterned feature to a nitrogen-containing plasma.

9. The method of claim 8, wherein the exposing the patterned feature to a nitrogen-containing plasma comprises directionally treating the patterned feature with an ion beam formed from a nitrogen-containing plasma.

10. A method for selectively forming a silicon oxide layer on a substrate, comprising:
    selectively depositing a silicon oxide layer within a patterned feature formed on a surface of a substrate, wherein the patterned feature comprises one or more sidewalls and a deposition surface at a bottom of the patterned feature, and each of the sidewalls has a base and a cap, wherein the cap comprises a silicon nitride and the base comprises silicon oxide, the deposition surface consisting essentially of silicon, and the selectively deposited silicon oxide layer is formed on the deposition surface by flowing tetraethyl orthosilicate (TEOS) and ozone over the patterned feature to fill the patterned feature from the bottom of the patterned feature so that the selectively deposited silicon oxide layer is adjacent to the base and the cap;

etching the selectively deposited silicon oxide layer after filling the patterned feature to preferentially etch the selectively deposited silicon oxide layer in the patterned feature from each cap to expose portions of each sidewall corresponding to each cap while the selectively deposited silicon oxide layer along each base remains intact and unexposed; and repeating flowing tetraethyl orthosilicate (TEOS) and ozone over the patterned feature and thereafter etching the selectively deposited silicon oxide layer.

11. The method of claim 10, further comprising:

after the selectively depositing a silicon oxide layer within a patterned feature formed on a surface of the substrate, annealing the selectively deposited silicon oxide layer.

12. The method of claim 11, further comprising:

after the annealing the selectively deposited silicon oxide layer, wet etching the silicon oxide layer.

13. The method of claim 10, wherein the tetraethyl orthosilicate (TEOS) flows into a 300 mm substrate processing chamber at a rate between 400 mg/minute and 2 g/minute.

14. The method of claim 13, wherein the ozone flows into the 300 mm substrate processing chamber at a rate of 10% to 18% by mass.

15. The method of claim 10, wherein the pressure in a processing chamber during operation is between 200 Torr and 700 Torr.

16. The method of claim 10, wherein the temperature during the anneal step is between 300 degrees Celsius and 480 degrees Celsius.

17. The method of claim 10, further comprising:

before the selectively depositing a silicon oxide layer within the patterned feature formed on a surface of a substrate, flowing a nitrogen-containing plasma over the patterned feature.

18. The method of claim 17, wherein the flowing a nitrogen-containing plasma over the patterned feature comprises directionally treating the patterned feature with an ion beam formed from the nitrogen-containing plasma.

19. A method for selectively forming a silicon oxide layer on a substrate, comprising:

selectively depositing a silicon oxide layer within a patterned feature formed on a surface of a substrate, wherein the patterned feature comprises one or more sidewalls and a deposition surface at a bottom of the patterned feature, and each of the sidewalls has a base and a cap, wherein the cap of each of the one or more sidewalls comprises a silicon nitride and the base comprises a silicon oxide, and a first surface area of the cap of each of the one or more sidewalls is at least one-third of a surface area of each sidewall and a second surface area of the base of each of the one or more sidewalls is at least a portion of the surface area of each sidewall, the deposition surface consisting essentially of silicon, and the selectively deposited silicon oxide layer is formed on the deposition surface by flowing tetraethyl orthosilicate (TEOS) and ozone over the patterned feature;

etching the selectively deposited silicon oxide layer within the patterned feature to a depth that exposes portions of each sidewall corresponding to each respective cap, and leaves the base portion of the sidewall unexposed; and annealing the selectively deposited silicon oxide layer.

* * * * *